(12) United States Patent
Huang et al.

(10) Patent No.: US 11,616,314 B2
(45) Date of Patent: Mar. 28, 2023

(54) ELECTRICAL CONNECTOR ASSEMBLY WITH IMPROVED SHIELDING EFFECT AND EASY INSTALLATION

(71) Applicant: DONGGUAN LUXSHARE TECHNOLOGIES CO., LTD, Dongguan (CN)

(72) Inventors: Bin Huang, Dongguan (CN); Rongzhe Guo, Dongguan (CN); Hongji Chen, Dongguan (CN); Huanhuan Shen, Dongguan (CN)

(73) Assignee: DONGGUAN LUXSHARE TECHNOLOGIES CO., LTD, Dongguan (CN)

(*) Notice: Subject to any disclaimer, the term of this patent is extended or adjusted under 35 U.S.C. 154(b) by 63 days.

(21) Appl. No.: 17/343,325

(22) Filed: Jun. 9, 2021

(65) Prior Publication Data

US 2022/0006217 A1 Jan. 6, 2022

(30) Foreign Application Priority Data

Jul. 3, 2020 (CN) .......................... 202010629625.X

(51) Int. Cl.
*H01R 12/71* (2011.01)
*H01R 12/58* (2011.01)
(Continued)

(52) U.S. Cl.
CPC ........... *H01R 12/714* (2013.01); *H01R 12/58* (2013.01); *H01R 12/7023* (2013.01);
(Continued)

(58) Field of Classification Search
CPC .. H01R 12/714; H01R 12/58; H01R 12/7023; H01R 13/6581; H01R 13/6594; H01R 13/24
(Continued)

(56) References Cited

U.S. PATENT DOCUMENTS

| 6,368,153 | B1* | 4/2002 | Hwang | .............. | H01R 13/6594 |
| | | | | | 439/607.2 |
| 6,416,361 | B1* | 7/2002 | Hwang | .............. | H01R 13/6582 |
| | | | | | 439/607.2 |

(Continued)

FOREIGN PATENT DOCUMENTS

| CN | 1135668 | A | * | 11/1996 | ......... | H01R 12/7064 |
| CN | 102918943 | B | * | 7/2014 | ......... | H01R 13/6271 |

(Continued)

*Primary Examiner* — Peter G Leigh
(74) *Attorney, Agent, or Firm* — Birch, Stewart, Kolasch & Birch, LLP

(57) ABSTRACT

An electrical connector assembly includes an electrical connector and a metal shielding shell. The electrical connector includes an insulating body and a number of conductive terminals. The insulating body includes a slot. Each conductive terminal includes an elastic abutting portion for abutting against the circuit board. The metal shielding shell includes a receiving cavity for receiving a mating connector. When the mating connector is inserted into the receiving cavity and has not yet made contact with the conductive terminals of the electrical connector, a better shielding effect can be achieved. Besides, by electrically connecting the conductive terminals and the circuit board in a mutually abutting manner, the requirement on the complexity of the circuit board manufacturing process is reduced.

20 Claims, 19 Drawing Sheets

(51) Int. Cl.
*H01R 12/70* (2011.01)
*H01R 13/6581* (2011.01)
*H01R 13/6594* (2011.01)
*H01R 13/24* (2006.01)

(52) U.S. Cl.
CPC ..... *H01R 13/6581* (2013.01); *H01R 13/6594* (2013.01); *H01R 13/24* (2013.01)

(58) Field of Classification Search
USPC .......................................................... 439/81
See application file for complete search history.

(56) References Cited

U.S. PATENT DOCUMENTS

| | | | | |
|---|---|---|---|---|
| 6,443,768 B1* | 9/2002 | Dirkers | ................ | H05K 9/0058 439/607.2 |
| 6,508,670 B1* | 1/2003 | Hwang | .............. | H01R 13/6594 439/607.37 |
| 6,517,382 B2* | 2/2003 | Flickinger | ............ | H05K 9/0058 439/607.23 |
| 6,612,868 B2* | 9/2003 | Hwang | .............. | H01R 13/6596 439/607.2 |
| 6,655,995 B1* | 12/2003 | Reisinger | ........... | H01R 13/6582 439/607.37 |
| 6,666,720 B1* | 12/2003 | Reisinger | ........... | H01R 13/6594 439/607.17 |
| 6,672,901 B2* | 1/2004 | Schulz | ................... | H05K 3/301 439/607.37 |
| 6,758,699 B1* | 7/2004 | Hwang | .............. | H01R 13/6658 439/676 |
| 6,872,094 B1* | 3/2005 | Murr | .................... | G02B 6/4201 439/607.2 |
| 6,881,095 B2* | 4/2005 | Murr | .................. | H01R 13/6335 439/607.2 |
| 6,926,551 B1* | 8/2005 | Schulz | .............. | H01R 13/6272 439/357 |
| 8,469,744 B2* | 6/2013 | Nichols | ................ | H05K 9/0058 439/607.01 |
| 9,608,377 B1* | 3/2017 | Phillips | ............... | H01R 13/7172 |
| 9,728,919 B1 | 8/2017 | Dunwoody et al. | | |
| 9,985,365 B2* | 5/2018 | Xie | .................... | H01R 12/7017 |
| 10,276,995 B2* | 4/2019 | Little | ................... | G02B 6/4284 |
| 2013/0178075 A1 | 7/2013 | Hsueh | | |

FOREIGN PATENT DOCUMENTS

| | | |
|---|---|---|
| CN | 107039855 A | 8/2017 |
| CN | 108418052 A | 8/2018 |
| TW | M357729 U | 5/2009 |
| TW | 201740626 A | 11/2017 |

* cited by examiner

ELECTRICAL CONNECTOR ASSEMBLY WITH IMPROVED SHIELDING EFFECT AND EASY INSTALLATION

CROSS-REFERENCE TO RELATED APPLICATION

This patent application claims priority of a Chinese Patent Application No. 202010629625.X, filed on Jul. 3, 2020 and titled "ELECTRICAL CONNECTOR ASSEMBLY AND ASSEMBLY THEREOF", the entire content of which is incorporated herein by reference.

TECHNICAL FIELD

The present disclosure relates to an electrical connector assembly, which belongs to a technical field of electrical connectors.

BACKGROUND

Electrical connectors usually include an insulating body and a plurality of conductive terminals fixed to the insulating body. Each conductive terminal includes a contact portion for mating with a mating connector and a mounting foot for being mounted to a circuit board. The connection between the mounting foot and the circuit board usually includes through hole soldering, surface soldering and press-fit etc. However, as the requirements for the transmission rate of the electrical connectors become higher and higher, the connection methods of the above-mentioned mounting foot and the circuit board are all facing great challenges. In addition, how to set a shielding structure to reduce interference to signal transmission is also a technical problem that needs to be solved by those of ordinary skill in the art.

SUMMARY

An object of the present disclosure is to provide an electrical connector assembly with better shielding effect and easy installation of an electrical connector to a circuit board.

In order to achieve the above object, the present disclosure adopts the following technical solution: an electrical connector assembly, comprising: an electrical connector, the electrical connector comprising an insulating body and a plurality of conductive terminals fixed to the insulating body, the insulating body comprising a slot and a mounting surface for being mounted on a circuit board, each conductive terminal comprising an elastic contact portion protruding into the slot and an elastic abutting portion extending toward the mounting surface, the elastic contact portion being adapted for mating with a mating connector, the elastic abutting portion being adapted for engaging with the circuit board; and a metal shielding shell, the metal shielding shell shielding the electrical connector, the metal shielding shell defining a receiving cavity in communication with the slot, the receiving cavity being located at a front end of the slot, and the slot and the receiving cavity being adapted for jointly receiving the mating connector.

In order to achieve the above object, the present disclosure adopts the following technical solution: an electrical connector assembly, comprising: a first electrical connector assembly; a second electrical connector; and a circuit board, the circuit board comprising a first side, a plurality of first conductive pads located on the first side, a second side opposite to the first side, and a plurality of second conductive pads located on the second side; the first electrical connector assembly comprising: an electrical connector, the electrical connector comprising an insulating body and a plurality of conductive terminals fixed to the insulating body, the insulating body comprising a slot and a mounting surface for being mounted on the circuit board, each conductive terminal comprising an elastic contact portion protruding into the slot and an elastic abutting portion extending toward the mounting surface, the elastic contact portion being adapted for mating with a mating connector, the elastic abutting portion being adapted for engaging with the circuit board; and a metal shielding shell, the metal shielding shell shielding the electrical connector, the metal shielding shell defining a receiving cavity in communication with the slot, the receiving cavity being located at a front end of the slot, and the slot and the receiving cavity being adapted for receiving the mating connector; wherein the first electrical connector assembly is mounted on the first side of the circuit board and abuts against the first conductive pads, and the second electrical connector is mounted on the second side of the circuit board and is electrically connected to the second conductive pads.

Compared with the prior art, the metal shielding shell of the present disclosure defines a receiving cavity at the front end of the slot, when the mating connector is inserted and has not yet been in contact with the conductive terminals of the electrical connector of the present disclosure, a better shielding environment can be provided by the metal shielding shell, thereby the quality of subsequent signal transmission can be improved. In addition, the conductive terminals of the electrical connector of the present disclosure are provided with elastic abutting portions for abutting against the circuit board. By making the elastic abutting portions abutting against the circuit board for electrical connection, the requirement on the complexity of the circuit board manufacturing process is reduced.

DETAILED DESCRIPTION

Figure 1:
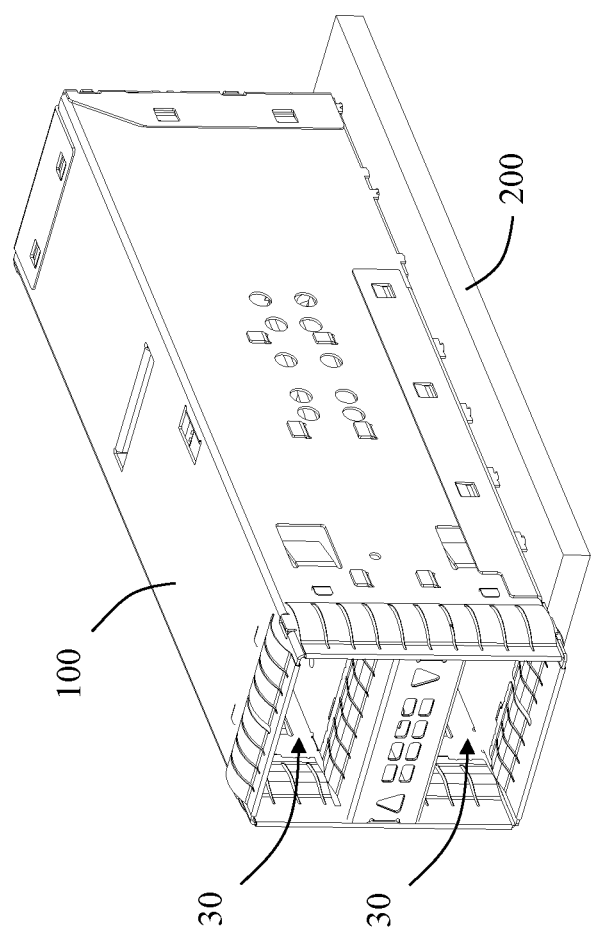
FIG. 1 is a perspective schematic view of an electrical connector assembly when mounted on a circuit board in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
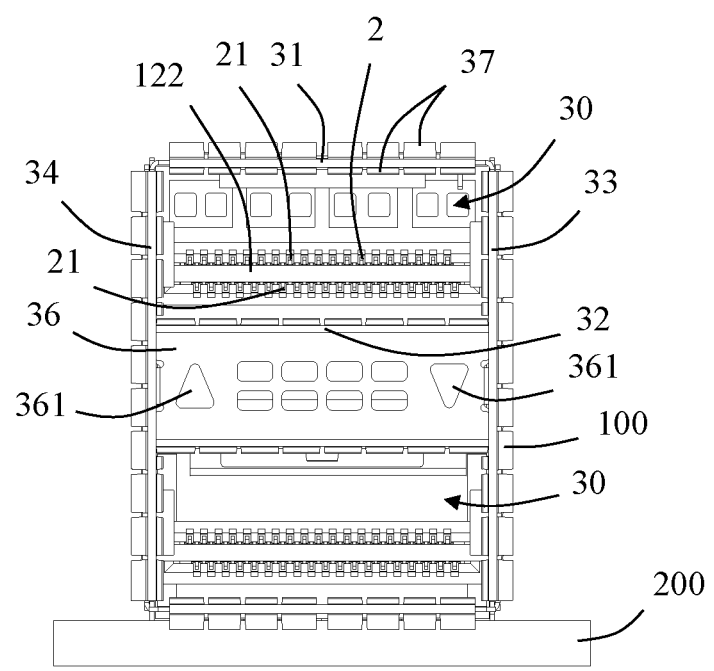
FIG. 2 is a front view of FIG. 1.
Figure 3:
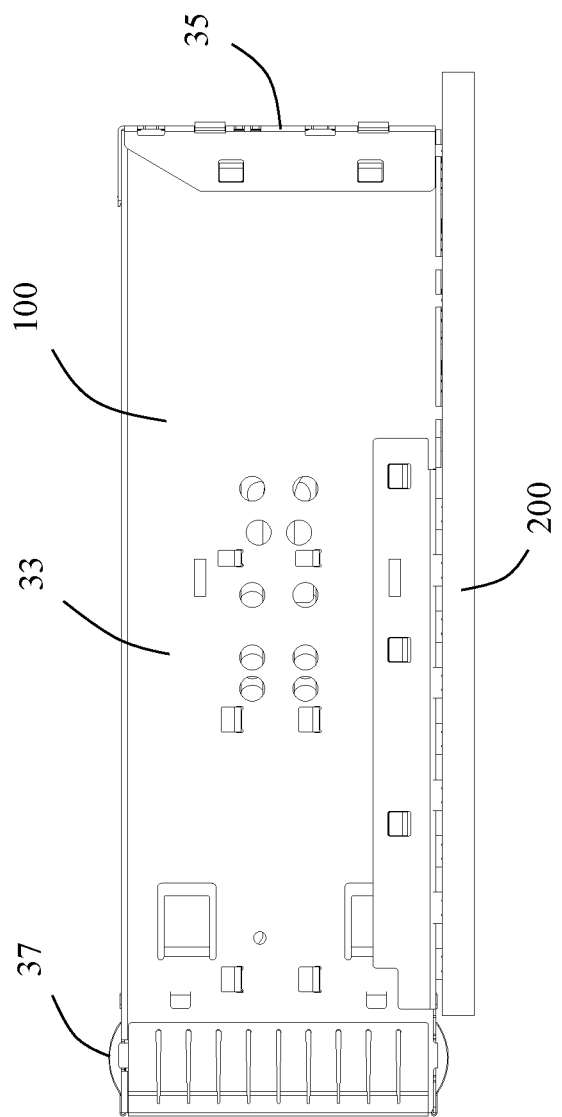
FIG. 3 is a right side view of FIG. 1.
Figure 4:
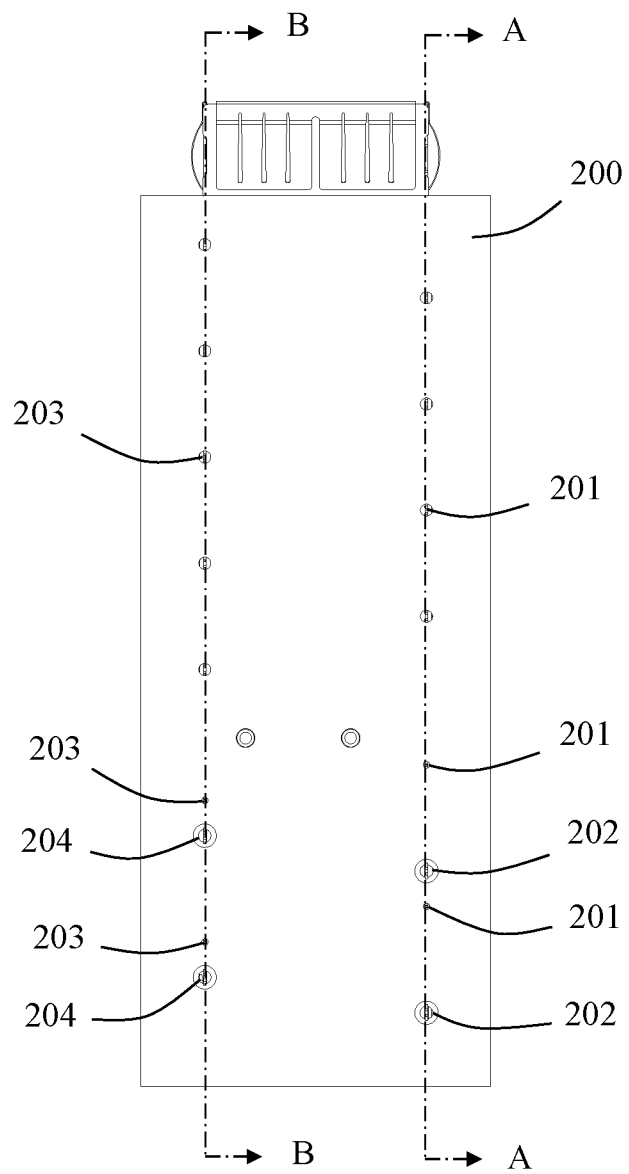
FIG. 4 is a bottom view of FIG. 1.
Figure 4:
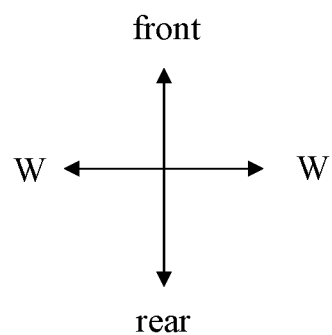
Figure 5:
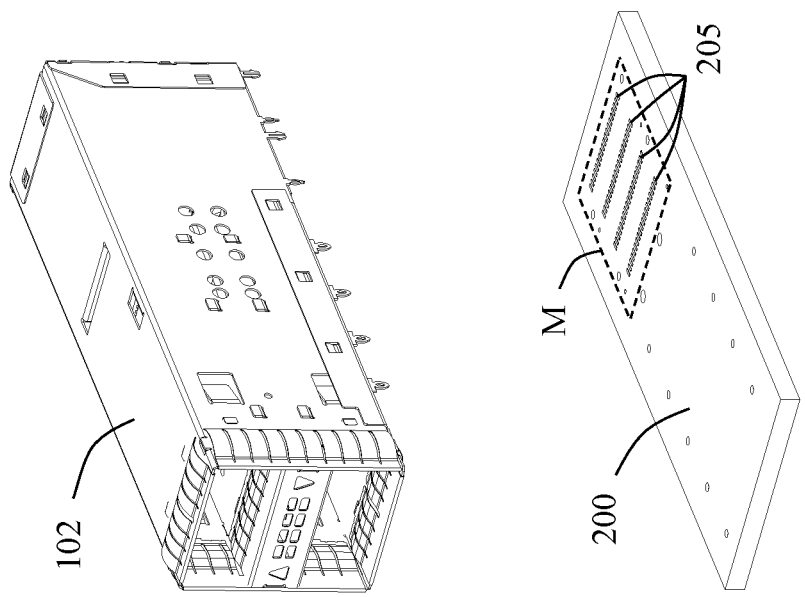
FIG. 5 is a partially exploded perspective view of FIG. 1.
Figure 6:
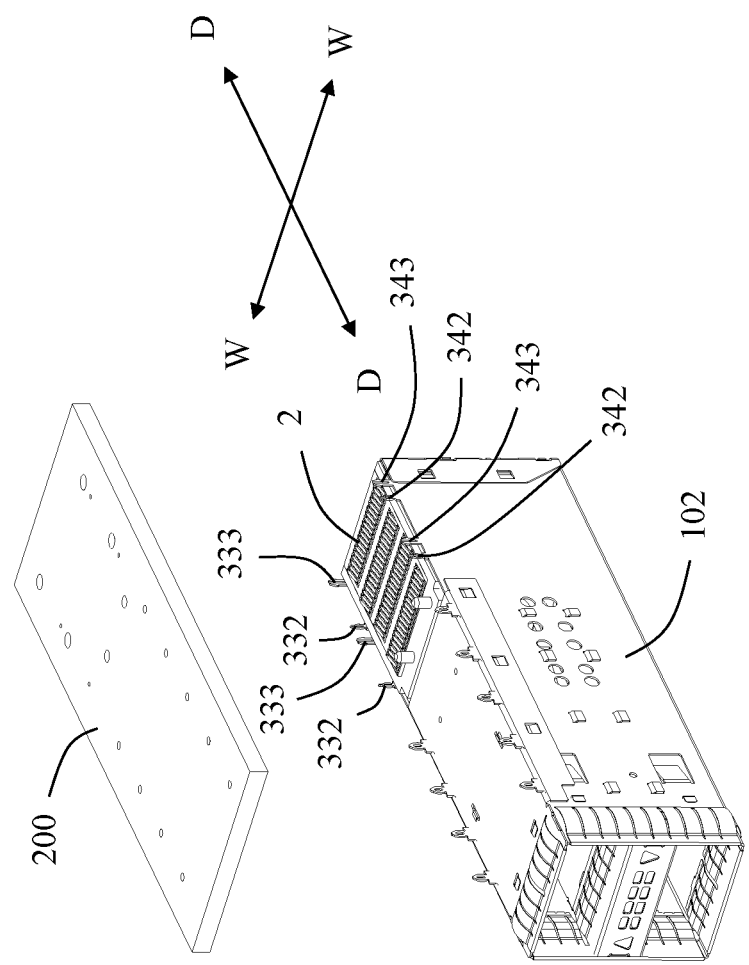
FIG. 6 is a partially exploded perspective view of FIG. 5 from another angle.

Referring to FIGS. 1 to 3, an illustrated embodiment of the present disclosure discloses an electrical connector assembly 100 for being mounted on a circuit board 200. Referring to FIGS. 4 to 6, in the illustrated embodiment of the present disclosure, the circuit board 200 includes a plurality of first conductive holes 201 and a plurality of first locking holes 202 on one side (for example, a right side in FIG. 4), and a plurality of second conductive holes 203 and a plurality of second locking holes 204 on the other side (for example, a left side in FIG. 4). Two first conductive holes 201 and two first locking holes 202 at a rear end are disposed alternately. Two second conductive holes 203 and two second locking holes 204 at a rear end are disposed alternately. From a perspective of a width direction W-W of the circuit board 200, the first conductive holes 201 and the second conductive holes 203 are arranged staggered (that is, not aligned), and the first locking holes 202 and the second locking holes 204 are arranged staggered (that is, not aligned). This arrangement facilitates the installation of electrical connectors on opposite sides of the circuit board 200 so as to achieve a modular arrangement. Referring to FIG. 5, in an area M where the two first conductive holes 201, the two first locking holes 202, the two second conductive holes 203 and the two second locking holes 204 are located, the circuit board 200 further includes multiple rows of conductive pads 205 (also called "golden fingers"). In the illustrated embodiment of the present disclosure, the conductive pads 205 are in four rows.

Figure 7:
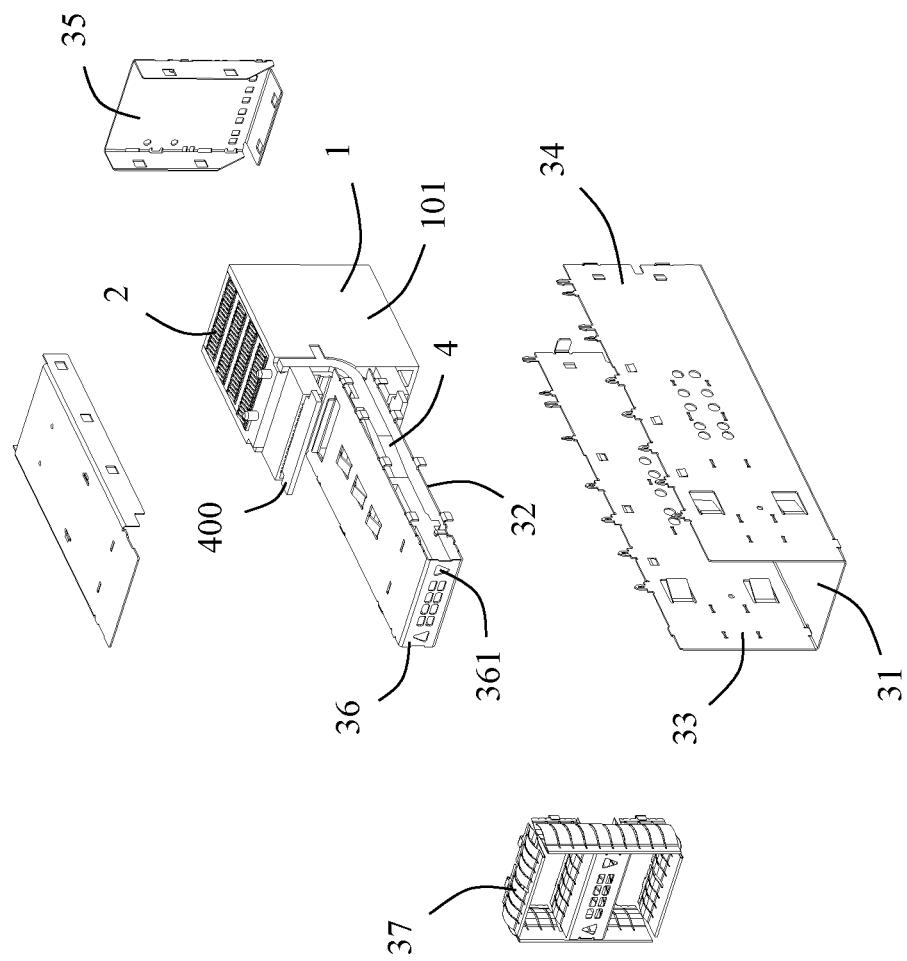
FIG. 7 is a partial perspective exploded view of the electrical connector assembly and a part of a mating connector in FIG. 6.
Figure 8:
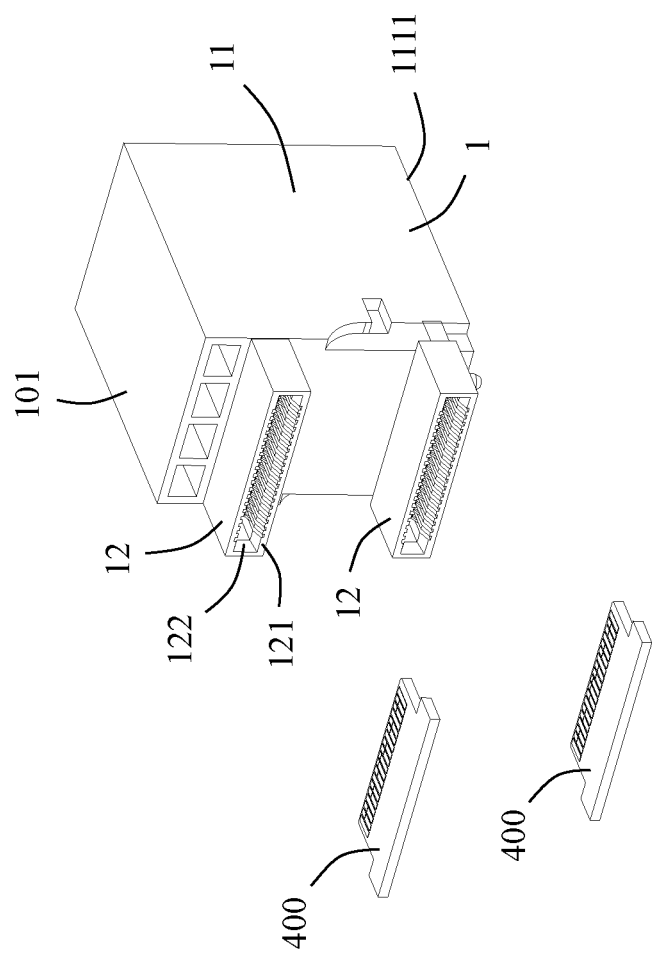
FIG. 8 is an exploded perspective view of an electrical connector and a part of the mating connector in FIG. 7.
Figure 9:
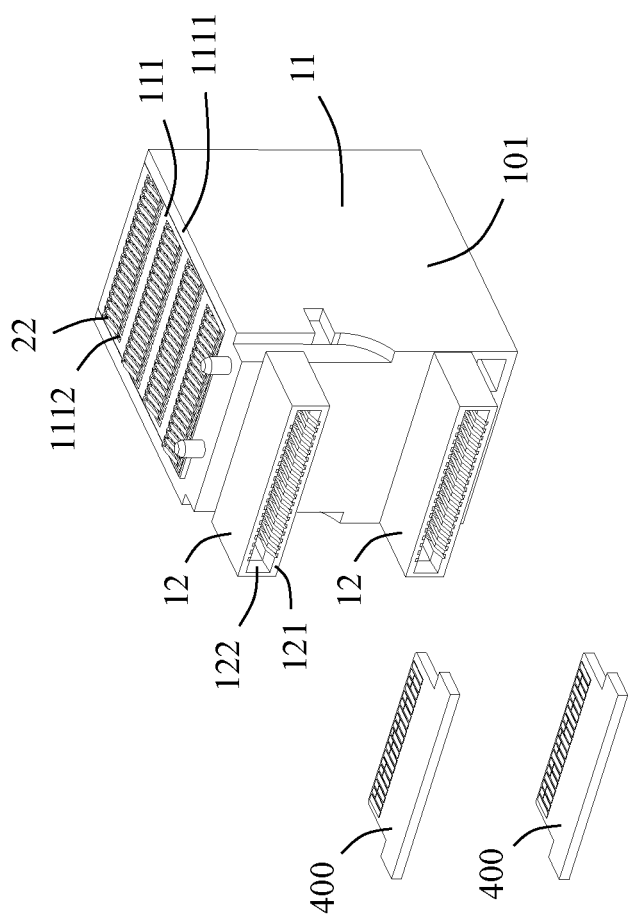
FIG. 9 is a perspective exploded view of FIG. 8 from another angle.
Figure 10:
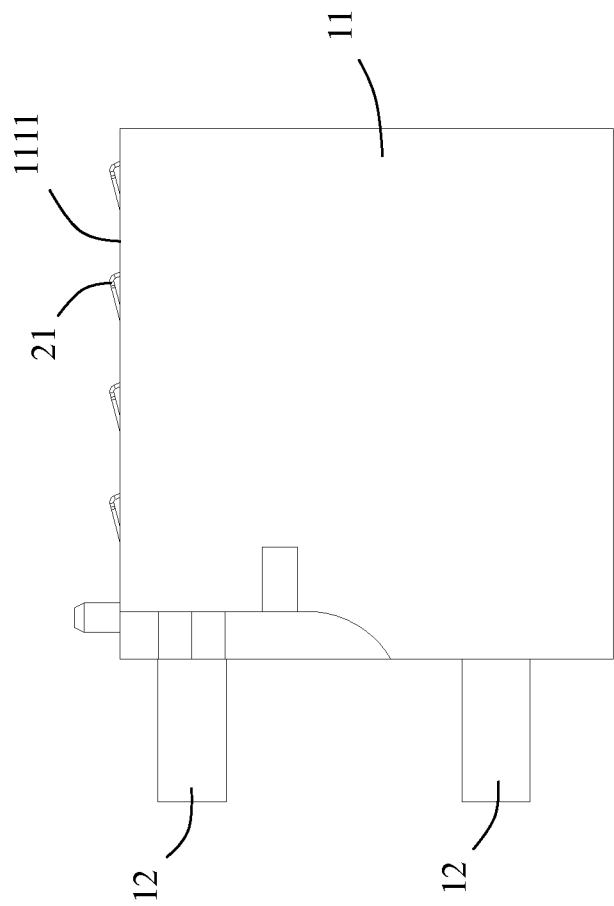
FIG. 10 is a right side view of the electrical connector in FIG. 9.
Figure 11:
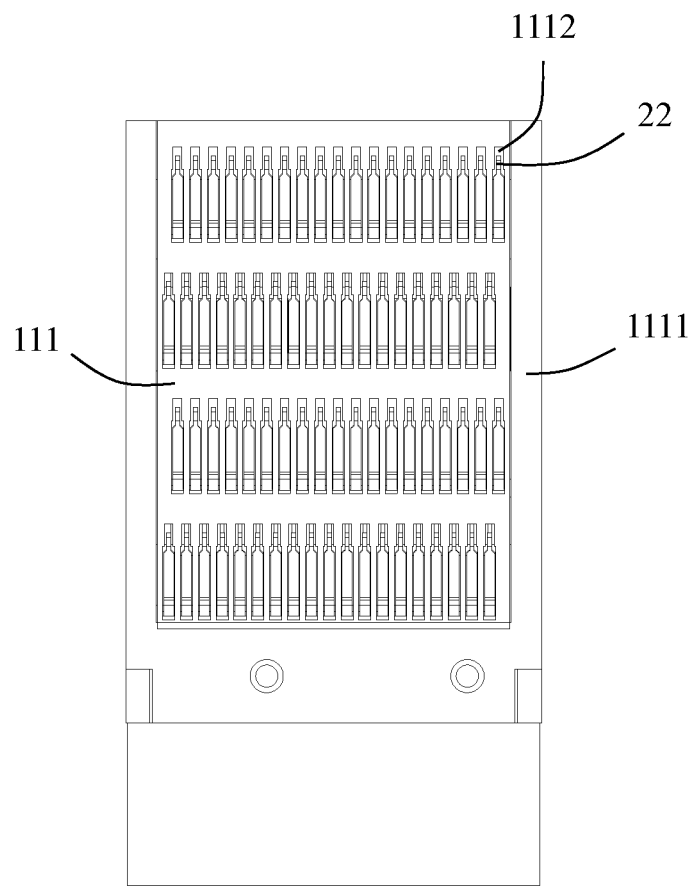
FIG. 11 is a top view of the electrical connector in FIG. 9.

Referring to FIGS. 6 and 7, the electrical connector assembly 100 includes an electrical connector 101 and a metal shielding shell 102 shielding the electrical connector 101. In the illustrated embodiment of the present disclosure, the electrical connector 101 is a high-speed connector, such as a QSFP connector, an SFP connector, an OSFP connector, or an OSFP-DD connector etc. Of course, in other embodiments, the electrical connector 101 may also be other types of connectors. In the illustrated embodiment of the present disclosure, the electrical connector 101 includes an insulating body 1 and a plurality of conductive terminals 2 fixed to the insulating body 1. In the illustrated embodiment of the present disclosure, the electrical connector 101 has a double-layer structure, which includes two connector ports that are stacked one over the other and have the same structure. Unless otherwise specified, only one connector port is used as an example for the following description.

Specifically, referring to FIGS. 8 to 11, the insulating body 1 includes a main body portion 11 and a protruding portion 12 extending forwardly from the main body portion 11. The main body 11 includes a mounting wall 111 at the bottom thereof. The mounting wall 111 has a mounting surface 1111 for being mounted on the circuit board 200 and a plurality of opening slots 1112 arranged at intervals. The opening slots 1112 extend through the mounting surface 1111. The protruding portion 12 includes a mating surface 121 and a slot 122 extending through the mating surface 121. The slot 122 is adapted for receiving a part of the mating connector (for example, a tongue plate 400 of the mating connector).

Figure 12:
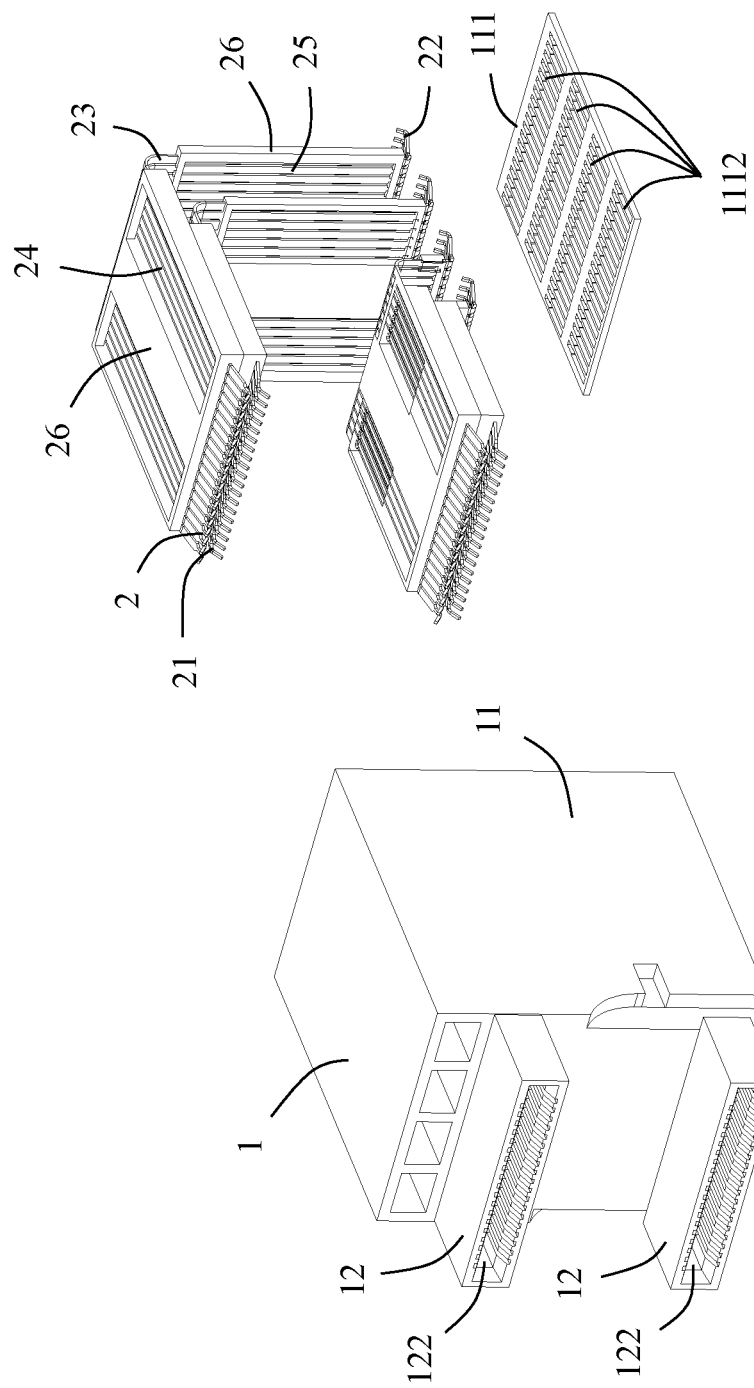
FIG. 12 is a partially exploded perspective view of the electrical connector in FIG. 8.
Figure 13:
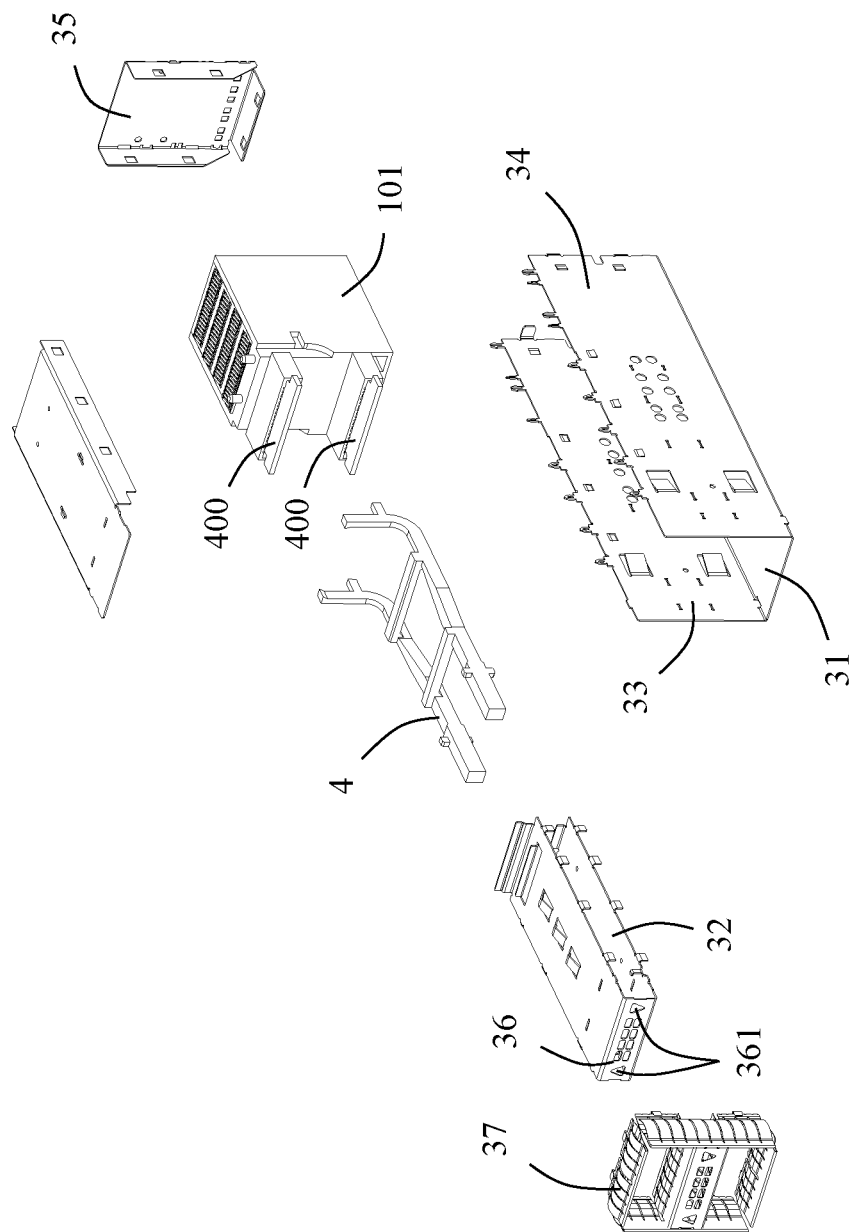
FIG. 13 is a further perspective exploded view of FIG. 7.
Figure 14:
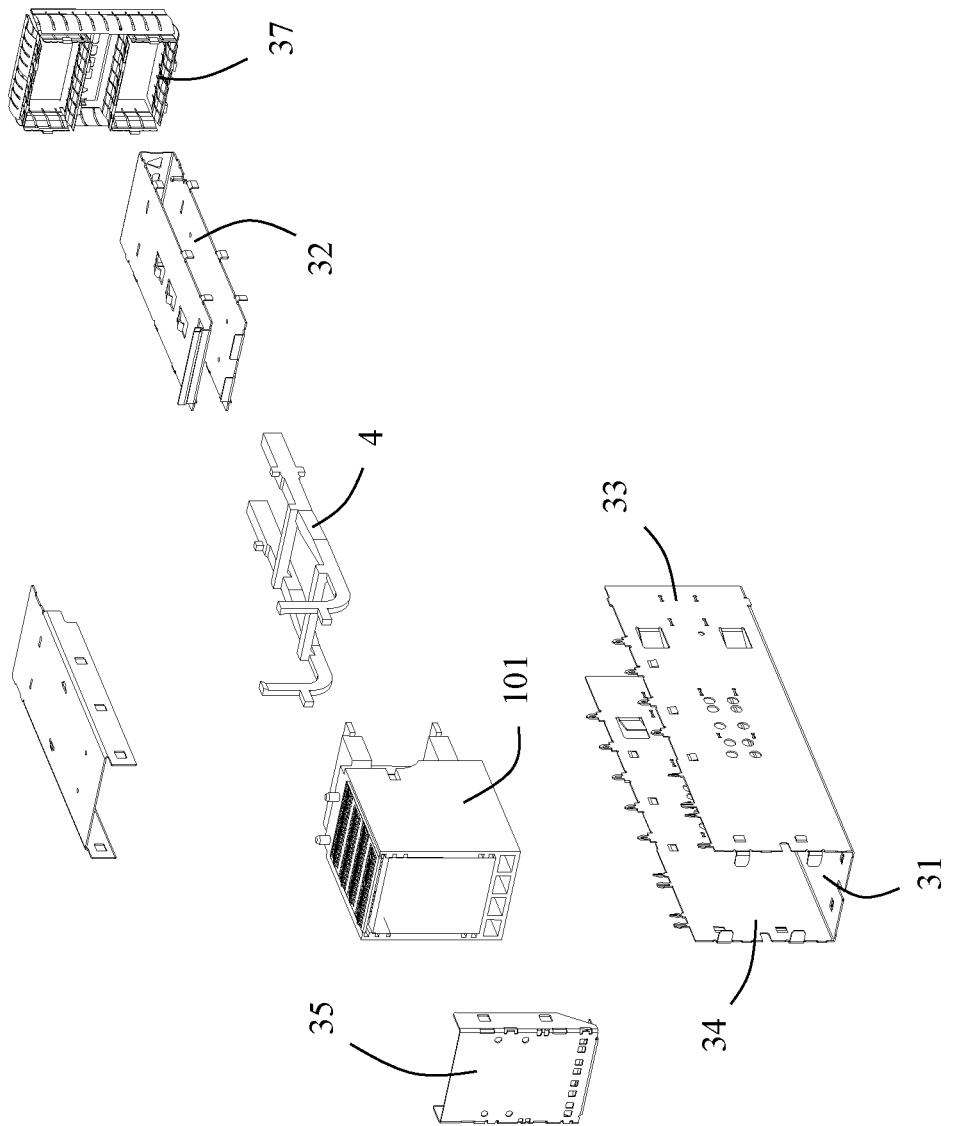
FIG. 14 is a perspective exploded view of FIG. 13 from another angle.

As shown in FIG. 12, each conductive terminal 2 includes an elastic contact portion 21 protruding into the slot 122 and an elastic abutting portion 22 extending toward the mounting surface 1111. The elastic abutting portion 22 protrudes beyond the mounting surface 1111. The elastic contact portion 21 is adapted for contacting with the mating connector. The elastic abutting portion 22 is adapted to abut against the corresponding conductive pad 205 of the circuit board 200 so as to achieve electrical connection. The elastic abutting portion 22 extends through the corresponding opening slot 1112 and further extends beyond the mounting surface 1111. By providing the opening slots 1112, on the one hand, the elastic abutting portions 22 can be separated from each other so as to avoid short circuit; on the other hand, the opening slots 1112 provide a certain deformation space for the elastic abutting portions 22 so as to facilitate abutting against the circuit board 200. In the illustrated embodiment of the present disclosure, the mounting wall 111 is arranged separately from the insulating body 1 and assembled to the insulating body 1.

In the illustrated embodiment of the present disclosure, each conductive terminal 2 includes a connecting portion 23 connected between the elastic contact portion 21 and the elastic abutting portion 22. The connecting portion 23 is of a bent configuration. The conductive terminal 2 further includes a first extension portion 24 connected between the elastic contact portion 21 and the connecting portion 23, and a second extension portion 25 connected between the connecting portion 23 and the elastic abutting portion 22. An extending direction of the first extension portion 24 is perpendicular to an extending direction of the second extension portion 25. An extending direction of the elastic abutting portion 22 is perpendicular to the extending direction of the second extension portion 25. The elastic abutting portion 22 extends in a direction away from the elastic contact portion 21. The elastic abutting portion 22 and the elastic contact portion 21 are parallel to each other. The elastic abutting portions 22 elastically abut against the circuit board 200. In the illustrated embodiment of the present disclosure, the connecting portions 23 are insert-molded in an insulating block 26 so as to form a plurality of terminal modules. In the illustrated embodiment of the present disclosure, the terminal modules are in four groups. Each two groups of the terminal modules form terminals of one connector port. Regarding one connector port, the elastic contact portions 21 located in the slot 122 are arranged in two rows along a vertical direction. The two rows of the elastic contact portions 21 jointly clamp a part of the mating connector. Of course, in other embodiments, the conductive terminals 2 can be fixed to the insulating body 1 by assembling. The combination of the conductive terminals 2 and the insulating body 1 can be flexibly adjusted according to actual requirements, which has been already well known by those skilled in the art and will not be repeated here in the present disclosure.

Referring to FIGS. 13 to 16, the metal shielding shell 102 includes a top wall 31, a bottom wall 32, a first side wall 33 connecting one side of the top wall 31 and one side of the bottom wall 32, a second side wall 34 connecting the other side of the top wall 31 and the other side of the bottom wall 32, and a rear wall 35 at the rear end. The metal shielding shell 102 is roughly cylindrical so as to have a better shielding effect. The top wall 31, the bottom wall 32, the first side wall 33 and the second side wall 34 are jointly enclosed so as to form a receiving cavity 30 for accommodating a most part of the mating connector (referring to FIG. 1). The receiving cavity 30 is in communication with the slot 122. The receiving cavity 30 is located at a front end of the slot 122. The slot 122 and the receiving cavity 30 are adapted for jointly receiving the mating connector.

Besides, the metal shielding shell 102 includes a mating surface 36 and an opening 361 exposed on the mating surface 36. The electrical connector 101 also includes a light guiding member 4. One end of the light guiding member 4 extends to the opening 361, and the other end is adjacent to the circuit board 200. With this arrangement, the light of the circuit board 200 displaying the working state can be transmitted to the mating surface 36 through the light guiding member 4, thereby facilitating observation. The metal shielding shell 102 further includes a plurality of elastic grounding claws 37 fixed to outer sides and inner sides of the top wall 31, the bottom wall 32, the first side wall 33 and the second side wall 34, respectively. The elastic grounding claws 37 are adjacent to the mating surface 36. The elastic grounding claws 37 located on the outer sides are adapted to connect the metal shielding shell 102 with other external grounding structures, thereby increasing the grounding area and improving the shielding effect. The elastic grounding claws 37 located on the inner sides protrude into the receiving cavity 30 for engaging with the mating connector. With this arrangement, on the one hand, contacting with the mating connector can be achieved so as to increase the shielding area; on the other hand, plug-in force with the mating connector can be increased so as to improve the connection stability between the electrical connector assembly 100 and the mating connector.

Figure 15:
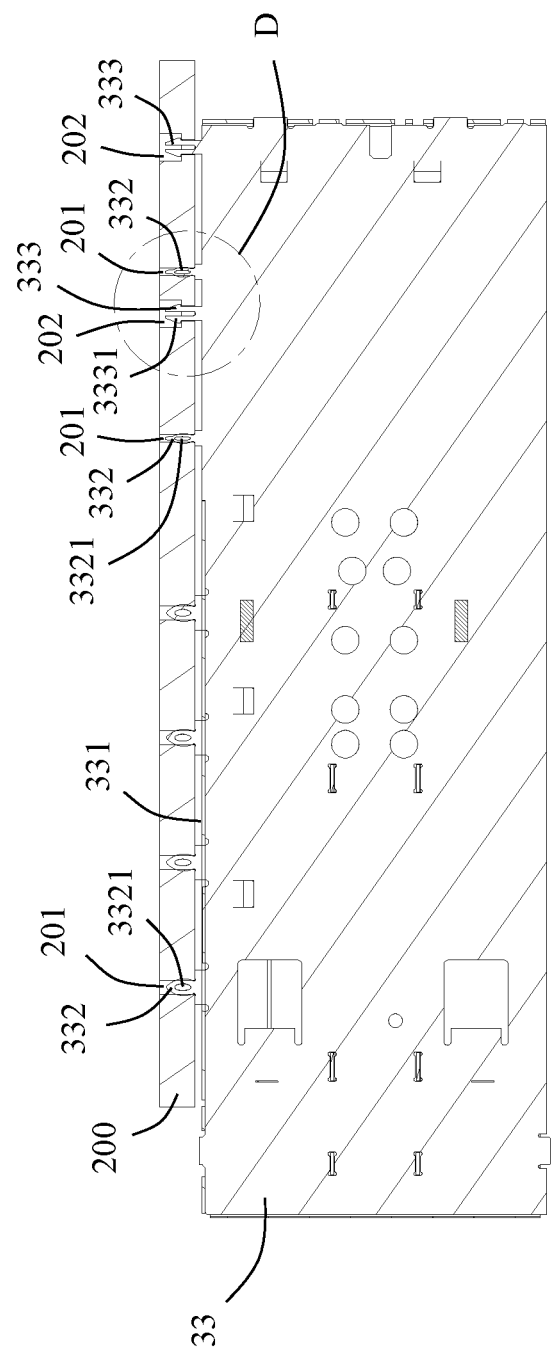
FIG. 15 is a schematic cross-sectional view taken along line A-A in FIG. 4.

Referring to FIG. 15, the first side wall 33 of the metal shielding shell 102 includes a first side edge 331, a plurality of first mounting feet 332 protruding from the first side edge 331, and a plurality of first locking feet 333 protruding from the first side edge 331. Along the first side edge 331, two first mounting feet 332 at a rear end (for example, a right side in FIG. 15) and the first locking feet 333 are arranged alternately. Each first mounting foot 332 defines a first through hole 3321 so that the first mounting foot 332 has elasticity to be easily pressed into the corresponding first conductive hole 201 of the circuit board 200. The first locking foot 333 includes a first barb 3331 which is adapted to be inserted into the corresponding first locking hole 202 of the circuit board 200 and be fixed to the circuit board 200.

Figure 16:
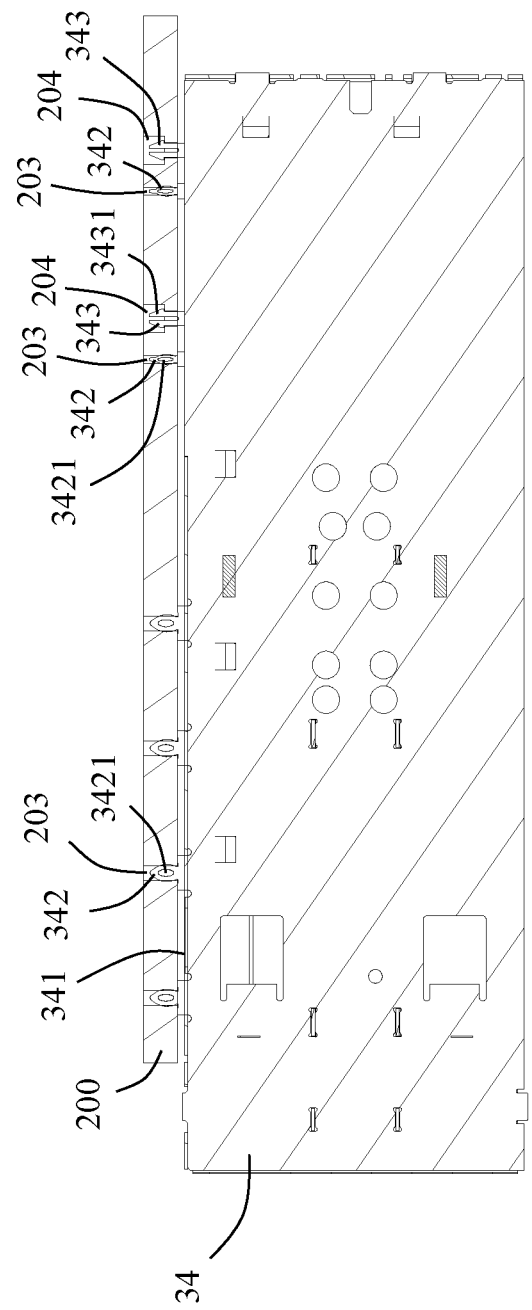
FIG. 16 is a schematic cross-sectional view taken along line B-B in FIG. 4.

Referring to FIG. 16, the second side wall 34 of the metal shielding shell 102 includes a second side edge 341, a plurality of second mounting feet 342 protruding from the second side edge 341, and a plurality of second locking feet 343 protruding from the second side edge 341. Along the second side edge 341, two second mounting feet 342 located at a rear end (for example, a right side in FIG. 16) and the second locking feet 343 are arranged alternately. Each second mounting foot 342 defines a second through hole 3421 so that the second mounting foot 342 has elasticity to be easily pressed into the corresponding second conductive hole 203 of the circuit board 200. The second locking foot 343 includes a second barb 3431 which is adapted to be inserted into the corresponding second locking hole 204 of the circuit board 200 and be fixed to the circuit board 200. Please further combine as shown in FIG. 6, the first locking feet 333 and the second locking feet 343 are staggered along the width direction W-W perpendicular to a mating direction D-D. The two first mounting feet 332 at the rear end and the two second mounting feet 342 at the rear end are staggered along the width direction W-W perpendicular to the mating direction D-D. This arrangement facilitates the two electrical connectors on opposite sides of the circuit board 200 to be fixedly mounted with the circuit board 200, thereby realizing a modular arrangement.

Figure 19:
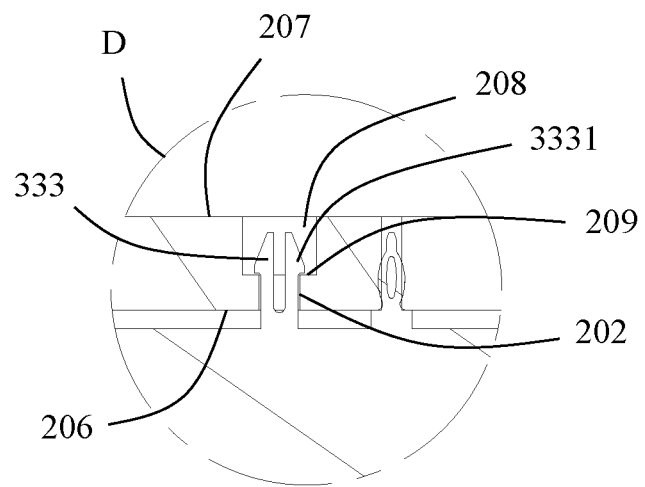
FIG. 19 is a partial enlarged view of a circled part D in FIG. 15.

Specifically, referring to FIG. 19, in the illustrated embodiment of the present disclosure, the circuit board 200 includes a first surface 206 facing the electrical connector 101 and a second surface 207 opposite to the first surface 206. The first locking holes 202 extend through the first surface 206. The circuit board 200 further includes a plurality of enlarged holes 208 extending through the second surface 207. Each enlarged hole 208 is in communication with the corresponding first locking hole 202. A diameter of the enlarged hole 208 is larger than a diameter of the first locking hole 202. Therefore, the circuit board 200 forms a locking surface 209 at a junction of the enlarged hole 208 and the first locking hole 202. When the first barb 3331 of the first locking foot 333 is inserted into the first locking hole 202 of the circuit board 200 and installed in place, the first barb 3331 is locked on the locking surface 209. As a result, the force generated when the elastic abutting portions 22 abut against the conductive pads 205 of the circuit board 200 can be overcome, and the contact reliability between the elastic abutting portions 22 and the circuit board 200 can be ensured. In the illustrated embodiment of the present disclosure, the first barb 3331 is located in the enlarged hole 208 and does not protrude beyond the second surface 207. With this arrangement, on the one hand, the overall height of the electrical connector 101 after being installed on the circuit board 200 is reduced; on the other hand, it also reduces the risk of the first locking feet 333 being damaged by external force.

Figure 17:
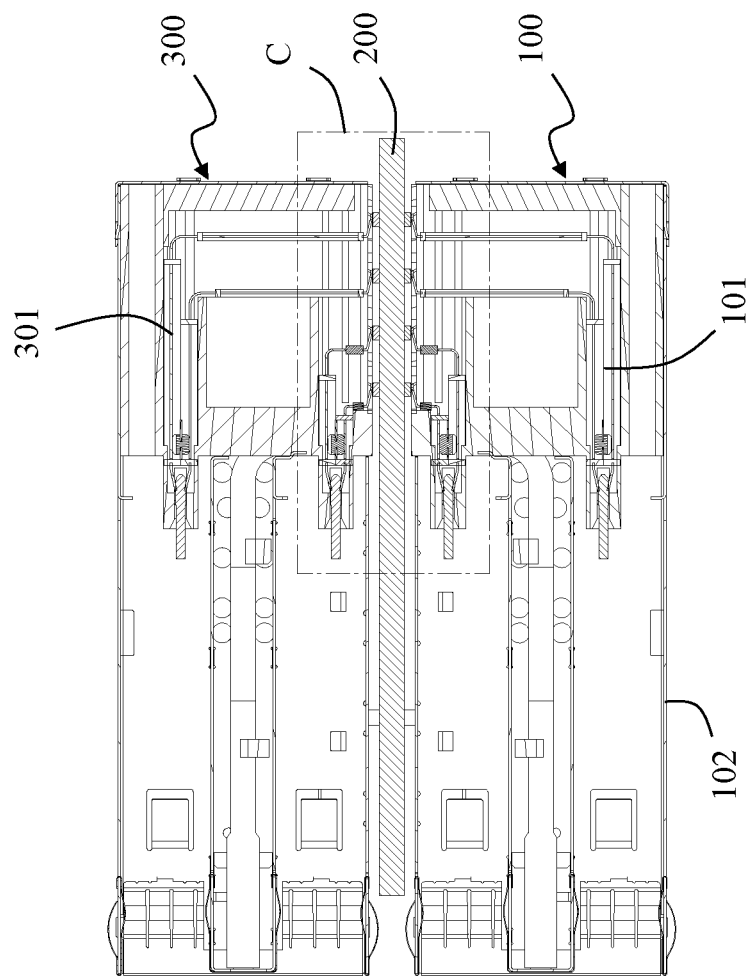
FIG. 17 is a front view of an electrical connector assembly in accordance with another embodiment of the present disclosure.
Figure 18:
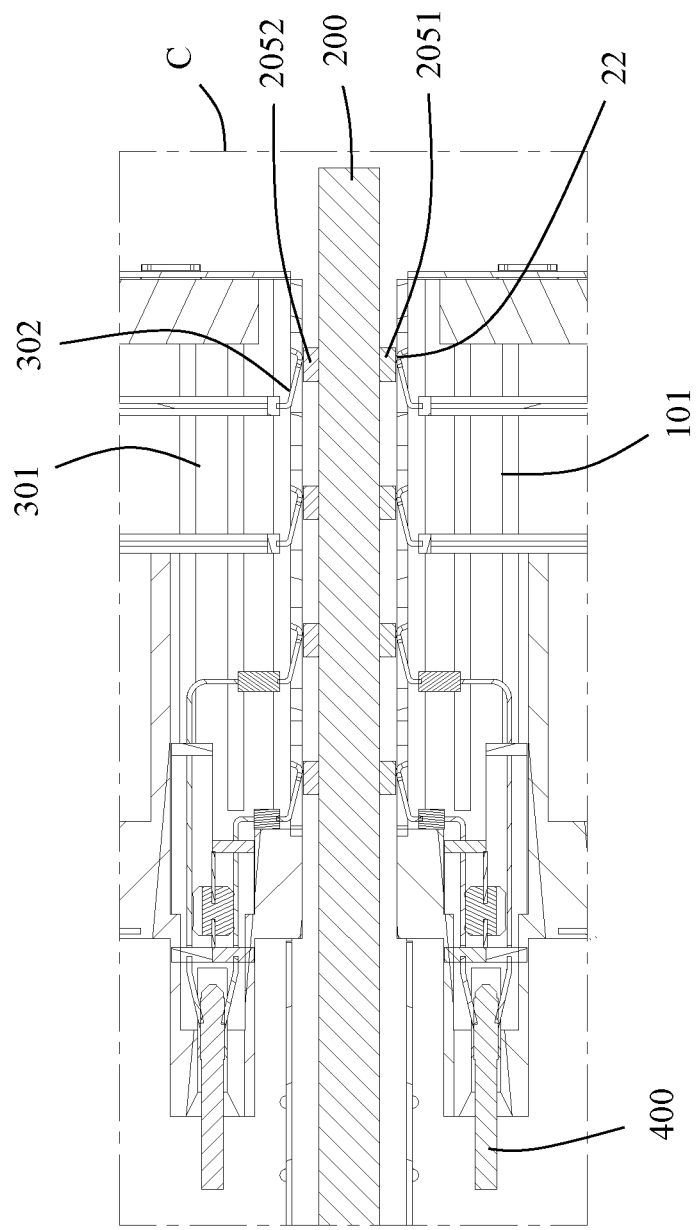
FIG. 18 is a partial enlarged view of a frame part C in FIG. 17.

Referring to FIGS. 17 and 18, the present disclosure also relates to an electrical connector assembly which includes a first electrical connector assembly, the circuit board 200 and a second electrical connector assembly 300. In the illustrated embodiment of the present disclosure, the first electrical connector assembly is the aforementioned electrical connector assembly 100. The second electrical connector assembly 300 is the same as the first electrical connector assembly. Of course, in other embodiments, the first electrical connector assembly and the second electrical connector assembly 300 can also be different. The second electrical connector assembly 300 includes a second electrical connector 301. The circuit board 200 has a first side (for example, a lower side), a plurality of first conductive pads 2051 located on the first side, a second side (for example, an upper side) opposite to the first side, and a plurality of second conductive pads 2052 located on the second side. The first electrical connector assembly is installed on the first side of the circuit board 200 and abuts against the first conductive pads 2051. The second electrical connector 301 is installed on the second side of the circuit board 200 and is electrically connected to the second conductive pads 2052. In an embodiment of the present disclosure, the conductive terminals 302 of the second electrical connector 301 elastically abut against the second conductive pads 2052. With this arrangement, since the first conductive pads 2051 and the second conductive pads 2052 are respectively arranged on opposite surfaces of the circuit board 200, it is convenient to arrange. In addition, this arrangement avoids setting through holes along a vertical direction in an area where the conductive terminals are electrically connected to the circuit board 200, thereby reducing adverse effects on signal transmission.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. An electrical connector assembly, comprising:
   an electrical connector, the electrical connector comprising an insulating body and a plurality of conductive terminals fixed to the insulating body, the insulating body comprising a slot and a mounting surface for being mounted on a circuit board, each conductive terminal comprising an elastic contact portion protruding into the slot and an elastic abutting portion extending toward the mounting surface, the elastic contact portion being adapted for mating with a mating connector, the elastic abutting portion being configured to elastically press against the circuit board; and
   a metal shielding shell, the metal shielding shell shielding the electrical connector, the metal shielding shell defining a receiving cavity in communication with the slot, the receiving cavity being located at a front end of the slot, and the slot and the receiving cavity being adapted for jointly receiving the mating connector;
   wherein the metal shielding shell comprises a first side edge, a plurality of first mounting feet protruding from the first side edge, a second side edge, and a plurality of second mounting feet protruding from the second side edge; the first mounting feet and the second mounting feet are configured to be secured to the circuit board along a first direction; and
   wherein the metal shielding shell further comprises at least one locking foot protruding from the first side edge and/or the second side edge; the at least one locking foot has at least one barb configured to be inserted into at least one locking hole of the circuit board, so that the at least one barb is in lock with the circuit board, thereby preventing the at least one locking foot from separating from the circuit board along a second direction opposite to the first direction.

2. The electrical connector assembly according to claim 1, wherein the first side edge and the second side edge are located on opposite sides of the metal shielding shell, respectively; and wherein the first mounting feet and the second mounting feet are arranged staggered along a width direction perpendicular to a mating direction.

3. The electrical connector assembly according to claim 2, wherein each first mounting foot defines a first through hole so that the first mounting foot has elasticity so as to be easily pressed into a first conductive hole of the circuit board;
   each second mounting foot defines a second through hole so that the second mounting foot has elasticity so as to be easily pressed into a second conductive hole of the circuit board.

4. The electrical connector assembly according to claim 3, wherein a plurality of locking feet are provided, the plurality of locking feet comprise a plurality of first locking feet protruding from the first side edge and a plurality of second locking feet protruding from the second side edge, the first locking feet and the second locking feet are arranged staggered along the width direction perpendicular to the mating direction, each first locking foot comprises a first barb, each second locking foot comprises a second barb, the first barb is adapted for being inserted into a first locking hole of the circuit board so as to be fixed with the circuit board, and the second barb is adapted for being inserted into a second locking hole of the circuit board so as to be fixed with the circuit board the at least one barb comprises the first barb and the second barb, and the at least one locking hole comprises the first locking hole and the second locking hole.

5. The electrical connector assembly according to claim 4, wherein along the first side edge, at least parts of the first mounting feet and the first locking feet are alternately disposed; and wherein along the second side edge, at least parts of the second mounting feet and the second locking feet are alternately disposed.

6. The electrical connector assembly according to claim 1, wherein the insulating body comprises a mounting wall on which the mounting surface is provided, the mounting wall comprises a plurality of opening slots arranged at intervals, and the elastic abutting portions are disposed in four rows along a mating direction and extend through the opening slots to extend beyond the mounting surface.

7. The electrical connector assembly according to claim 1, wherein the metal shielding shell comprises a top wall, a bottom wall, a first side wall connecting one side of the top wall and one side of the bottom wall, and a second side wall connecting the other side of the top wall and the other side of the bottom wall; and wherein the receiving cavity is jointly enclosed by the top wall, the bottom wall, the first side wall and the second side wall.

8. The electrical connector assembly according to claim 1, wherein the metal shielding shell comprises a mating surface and an opening exposed on the mating surface; and wherein the electrical connector comprises a light guiding member extending to the opening.

9. The electrical connector assembly according to claim 1, wherein the elastic contact portions disposed in the slot are arranged in two rows, and the two rows of the elastic contact portions jointly clamp a part of the mating connector.

10. The electrical connector assembly according to claim 1, wherein the elastic abutting portion protrudes beyond the mounting surface.

11. The electrical connector assembly according to claim 1, wherein each conductive terminal further comprises a connecting portion connected between the elastic contact portion and the elastic abutting portion; and the connecting portion is of a bent configuration.

12. The electrical connector assembly according to claim 11, wherein each conductive terminal further comprises a first extension portion connected between the elastic contact portion and the connecting portion and a second extension portion connected between the connecting portion and the elastic abutting portion; wherein an extending direction of the first extension portion is perpendicular to an extending direction of the second extension portion; and wherein an extending direction of the elastic abutting portion is perpendicular to the extending direction of the second extension portion.

13. The electrical connector assembly according to claim 11, wherein the elastic abutting portion extends in a direction away from the elastic contact portion, and the elastic abutting portion and the elastic contact portion are parallel to each other.

14. The electrical connector assembly according to claim 1, wherein the circuit board comprises a first surface facing the electrical connector assembly and a second surface opposite to the first surface, the at least one locking hole extends through the first surface, the circuit board further comprises an enlarged hole extending through the second surface, the enlarged hole is in communication with the at least one locking hole, the circuit board forms a locking surface at a junction of the enlarged hole and the at least one locking hole, and the at least one barb is locked on the locking surface.

15. The electrical connector assembly according to claim 14, wherein the at least one barb does not protrude beyond the second surface.

16. An electrical connector assembly, comprising:
a first electrical connector assembly;
a second electrical connector; and
a circuit board, the circuit board comprising a first side, a plurality of first conductive pads located on the first side, a second side opposite to the first side, and a plurality of second conductive pads located on the second side;
the first electrical connector assembly comprising:
an electrical connector, the electrical connector comprising an insulating body and a plurality of first conductive terminals fixed to the insulating body, the insulating body comprising a slot and a mounting surface for being mounted on the circuit board, each first conductive terminal comprising an elastic contact portion protruding into the slot and a first elastic abutting portion extending toward the mounting surface, the elastic contact portion being adapted for mating with a mating connector, the first elastic abutting portion being adapted for engaging with the circuit board; and
a metal shielding shell, the metal shielding shell shielding the electrical connector, the metal shielding shell defining a receiving cavity in communication with the slot, the receiving cavity being located at a front end of the slot, and the slot and the receiving cavity being adapted for receiving the mating connector;
the second electrical connector comprising a plurality of second conductive terminals, each second conductive terminal comprising a second elastic abutting portion;
wherein the first electrical connector assembly is mounted on the first side of the circuit board with the first elastic abutting portions elastically pressing against the first conductive pads, and the second electrical connector is mounted on the second side of the circuit board with the second elastic abutting portions elastically pressing against the second conductive pads.

17. The electrical connector assembly according to claim 16, wherein the metal shielding shell comprises a first side edge, a plurality of first mounting feet protruding from the first side edge, a second side edge and a plurality of second mounting feet protruding from the second side edge; the first mounting feet and the second mounting feet are configured to be secured to the circuit board along a first direction; and
wherein the metal shielding shell further comprises at least one locking foot protruding from the first side edge and/or the second side edge; the at least one locking foot has at least one barb configured to be inserted into at least one locking hole of the circuit board, so that the at least one barb is in lock with the circuit board, thereby preventing the at least one locking foot from separating from the circuit board along a second direction opposite to the first direction.

18. The electrical connector assembly according to claim 17, wherein the circuit board comprises a first surface facing the first electrical connector assembly and a second surface opposite to the first surface, the at least one locking hole extends through the first surface, the circuit board further comprises an enlarged hole extending through the second surface, the enlarged hole is in communication with the at least one locking hole, the circuit board forms a locking surface at a junction of the enlarged hole and the at least one locking hole, and the at least one barb is locked on the locking surface.

19. The electrical connector assembly according to claim 18, wherein the at least one barb does not protrude beyond the second surface.

20. An electrical connector assembly, comprising:
an electrical connector, the electrical connector comprising an insulating body and a plurality of conductive terminals fixed to the insulating body, the insulating body comprising a slot and a mounting surface for being mounted on a circuit board, the circuit board being configured to include a first surface facing the electrical connector assembly, a second surface opposite to the first surface, at least one locking hole extending through the first surface, an enlarged hole extending through the second surface and being in communication with the at least one locking hole, and a locking surface at a junction of the enlarged hole and the at least one locking hole; each conductive terminal comprising an elastic contact portion protruding into the slot and an elastic abutting portion extending toward the mounting surface, the elastic contact portion being adapted for mating with a mating connector, the elastic abutting portion being configured to elastically abut against the circuit board; and a metal shielding shell, the metal shielding shell shielding the electrical connector, the metal shielding shell defining a receiving cavity in communication with the slot, the receiving cavity being located at a front end of the slot, and the slot and the receiving cavity being adapted for jointly receiving the mating connector;

wherein the metal shielding shell comprises a first side edge, a plurality of first mounting feet protruding from the first side edge, a second side edge, and a plurality of second mounting feet protruding from the second side edge; the first mounting feet and the second mounting feet are configured to be secured to the circuit board; and wherein the metal shielding shell further comprises at least one locking foot protruding from the first side edge and/or the second side edge; and the at least one locking foot has at least one barb which is inserted into the at least one locking hole so as to be locked on the locking surface.

* * * * *